United States Patent
Kim et al.

(10) Patent No.: US 8,873,327 B2
(45) Date of Patent: Oct. 28, 2014

(54) SEMICONDUCTOR DEVICE AND OPERATING METHOD THEREOF

(71) Applicant: SK hynix Inc., Icheon-si (KR)

(72) Inventors: Hong-Sik Kim, Seongnam-si (KR); Hyung-Dong Lee, Gyeonggi-Do (KR); Young-Suk Moon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/970,844

(22) Filed: Aug. 20, 2013

(65) Prior Publication Data
US 2014/0092698 A1 Apr. 3, 2014

(30) Foreign Application Priority Data
Sep. 28, 2012 (KR) .......................... 10-2012-0108991

(51) Int. Cl.
G11C 7/00 (2006.01)
G11C 11/34 (2006.01)

(52) U.S. Cl.
CPC ...................................... *G11C 11/34* (2013.01)

USPC ................... 365/222; 365/233.1; 365/233.12; 365/230.03; 365/241

(58) Field of Classification Search
CPC ...... G11C 11/34; G11C 11/401; G11C 29/02; G11C 29/028; G11C 29/50016; G11C 29/56012; G11C 11/406
USPC ............. 365/222, 233.1, 233.12, 230.03, 241
See application file for complete search history.

(56) References Cited

U.S. PATENT DOCUMENTS

2003/0135794 A1* 7/2003 Longwell et al. ............... 714/42
2009/0282189 A1 11/2009 Best et al.

FOREIGN PATENT DOCUMENTS

KR  1020060130443 A  12/2006

* cited by examiner

*Primary Examiner* — Thong Q Le
(74) *Attorney, Agent, or Firm* — William Park & Associates Patent Ltd.

(57) ABSTRACT

An operating method of a semiconductor device may comprise monitoring error handling information corresponding to an address of a semiconductor memory device, setting a refresh period for the address considering the error handling information and requesting a refresh request for the address.

17 Claims, 6 Drawing Sheets

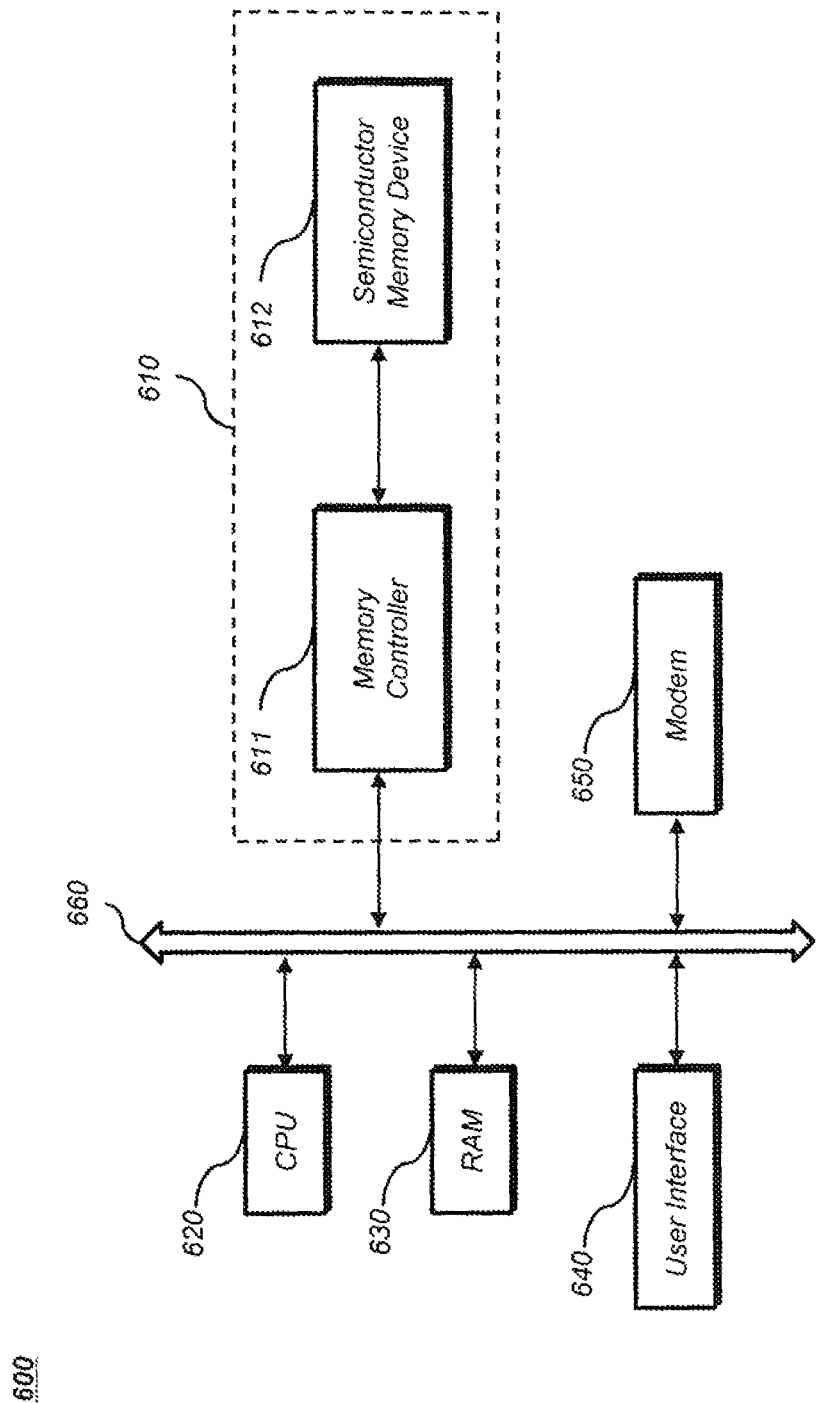

SEMICONDUCTOR DEVICE AND OPERATING METHOD THEREOF

CROSS-REFERENCE TO RELATED APPLICATIONS

The present application claims priority of Korean Patent Application No. 10-2012-0108991, filed on Sep. 28, 2012, which is incorporated herein by reference in its entirety.

BACKGROUND

1. Technical Field

Embodiments of the present invention generally relate to a semiconductor device and an operating method thereof, and more particularly to a semiconductor device capable of adjusting refresh period at an address of a semiconductor memory device by monitoring error handling information at the address of the semiconductor memory device and an operating method thereof.

2. Related Art

A semiconductor memory device such as a dynamic random-access memory (DRAM) may be controlled by a memory controller. And the memory controller may comprise a refresh controller controlling refresh operations of the semiconductor memory device.

The refresh controller sends a refresh request to an arbiter in the memory controller every refresh period, for example 64 ms. If the arbiter receives the refresh request the arbiter process the refresh request before other read or write requests from a host.

Since the memory controller according to a prior art controls refresh operations with the same refresh period throughout the entire region of the semiconductor memory device, it cannot deal with errors caused by deterioration of data retention characteristics at randomly located memory cells of the semiconductor memory device.

SUMMARY

Various embodiments are directed to a semiconductor device capable of adjusting refresh period at an address of a semiconductor memory device by monitoring error handling information at the address of the semiconductor memory device and an operating method thereof.

In an embodiment, an operating method of a semiconductor device may comprise monitoring error handling information corresponding to an address of a semiconductor memory device, setting a refresh period for the address considering the error handling information and requesting a refresh request for the address.

In the operating method, the monitoring error handling information may comprise receiving error detection information and/or error correction information for a data from the address of the semiconductor memory device; and updating number of errors occurred at the address.

In the operating method, the updating may comprise setting a first period as a refresh period for the address when the number of errors is smaller than a first threshold value and setting a second period shorter than the first period as the refresh period for the address when the number of errors is larger than the first threshold value.

In an embodiment, a semiconductor device may comprise an error handling block detecting and/or correcting an error in a data and generating error handling information and a refresh controller generating a refresh request for an address of a semiconductor memory device with a refresh period determined by the error handling information.

In the semiconductor device, the refresh controller may comprise an error register storing number of errors occurring at the address and the refresh controller determines the refresh period of the address according to the number of errors at the address.

In the semiconductor device, the refresh controller may further comprise a mode selector for determining a refresh mode at the address by referring the error register; and a refresh request generator for generating the refresh request for the address with the refresh period determined for the refresh mode at the address.

In the semiconductor device, the refresh request generator may comprise a clock signal generator for generating a first clock signal and a pulse signal generator for generating a pulse signal from the first clock signal having a period as same as the refresh period at the address.

In an embodiment, a system may comprise a semiconductor memory device and a memory controller for controlling the semiconductor memory device, wherein the memory controller may include an error handling block detecting and/or correcting an error in a data and generating error handling information; and a refresh controller generating a refresh request for an address of a semiconductor memory device with a refresh period determined by the error handling information.

In the system, the refresh controller may comprise an error register storing number of errors occurring at the address and the refresh controller determines the refresh period of the address according to the number of errors at the address.

In the system, the refresh controller may further comprise a mode selector for determining a refresh mode at the address by checking the error register; and a refresh request generating block for generating the refresh request for the address with the refresh period determined by the refresh mode at the address.

In the system, the refresh request generating block may comprise a clock signal generator for generating a first clock; and a refresh pulse generator for generating a pulse signal from the first clock signal having a period same as the refresh period at the address.

In an embodiment, a semiconductor device includes: an error handling block configured to provide error detection and/or error correction information of a data from a semiconductor memory device; and a refresh controller configured to monitor error handling information of the semiconductor memory device and determine a refresh period according to the error handling information.

In the semiconductor device, the refresh controller is configured to count a number of errors occurring at a plurality of banks and set a refresh period for each of the plurality of banks.

The semiconductor device further includes an error register configured to count the number of errors by monitoring the error handling information from the error handling block.

The semiconductor device further includes a mode selector configured to compare the number of errors with a threshold value and select a refresh mode for the corresponding bank from the plurality of banks.

The semiconductor device further includes a refresh request generator configured to refresh requests with the refresh period determined by a refresh mode.

In an embodiment, a memory system includes: a semiconductor memory device; and a memory controller for controlling the semiconductor memory device. The memory controller comprises: an error handling block detecting and/or correcting an error in a data and generating error handling information; and a refresh controller generating a refresh request for an address of a semiconductor memory device with a refresh period determined by the error handling information.

In an embodiment, an electronic device includes: a memory system communicatively coupled to a central processing unit; the memory system including a memory controller. The memory controller includes: an error handling block detecting and/or correcting an error in a data and generating error handling information; and a refresh controller generating a refresh request for an address of a semiconductor memory device with a refresh period determined by the error handling information.

BRIEF DESCRIPTION OF THE DRAWINGS

FIG. 6 is a block diagram illustrating an electronic device in according with an embodiment of the present invention.

DETAILED DESCRIPTION

Figure 1:
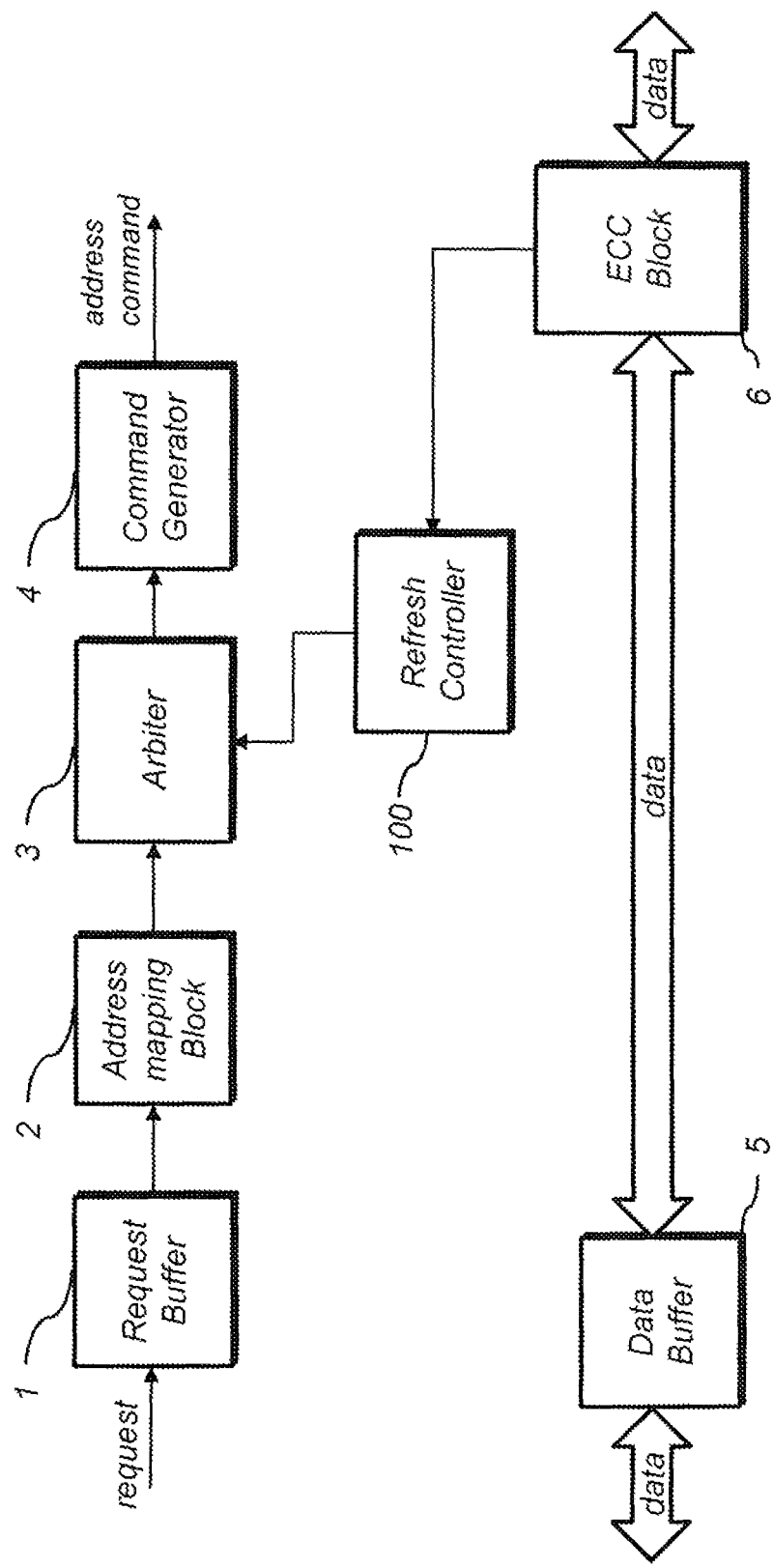
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with an embodiment of the present invention.

The semiconductor device in accordance with the embodiments of the present invention may be embodied as a memory controller for controlling a semiconductor memory device or a processor including the memory controller. Therefore memory controller in the disclosure may designate a memory controller itself or a processor including the memory controller therein.

The semiconductor device in FIG. 1 may include a request buffer 1; an address mapping block 2 which maps a logical address from a host to a physical address of the semiconductor memory device; an arbiter 3 which determines processing order among requests from host and the refresh controller 100; a command generator 4 for generating a command for controlling the semiconductor memory device corresponding to a request selected at the arbiter 3; and a data buffer 5 for temporarily storing a data to and from the host and an error-correction code (ECC) block 6 which detects and/or corrects errors in a data read from the semiconductor memory device.

The functions and structures of the request buffer 1, the address mapping block 2, the arbiter 3, the command generator 4, the data buffer 5, and the ECC block 6 are known. The ECC block 6 in accordance with an embodiment of the present invention may provide error handling information, such as error detection and/or error correction information, of a data read from the semiconductor memory device to the refresh controller 100.

The refresh controller 100 may monitor error handling information which may include an address of the semiconductor memory device where the error has occurred and may determine refresh period at the address of the semiconductor memory device according to the error handling information at the address.

In the disclosure, it is assumed that the semiconductor memory device includes a plurality of ranks each including a plurality of banks. The refresh controller 100 may count number of errors occurring at each bank and the refresh controller 100 may set different refresh period for each bank. In other embodiments, the memory cells may be grouped by different unit, and the refresh controller may count number of errors occurring at each group each having that unit number of memory cells and the refresh controller may set different refresh period for each group.

Figure 2:
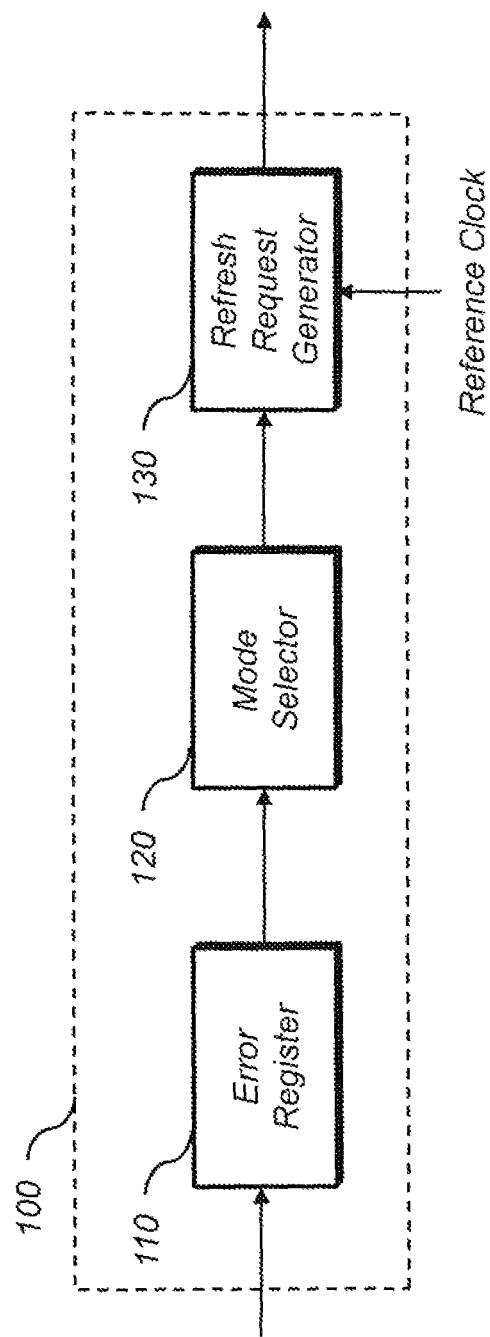
FIG. 2 is a block diagram illustrating a refresh controller in FIG. 1.

FIG. 2 illustrates a block diagram illustrating a refresh controller in FIG. 1.

The refresh controller 100 in accordance with an embodiment of the present invention may include an error register 110, a mode selector 120 and a refresh request generator 130.

The error register 110 may count number of errors by monitoring error handling information from the ECC block 6.

Figure 3:
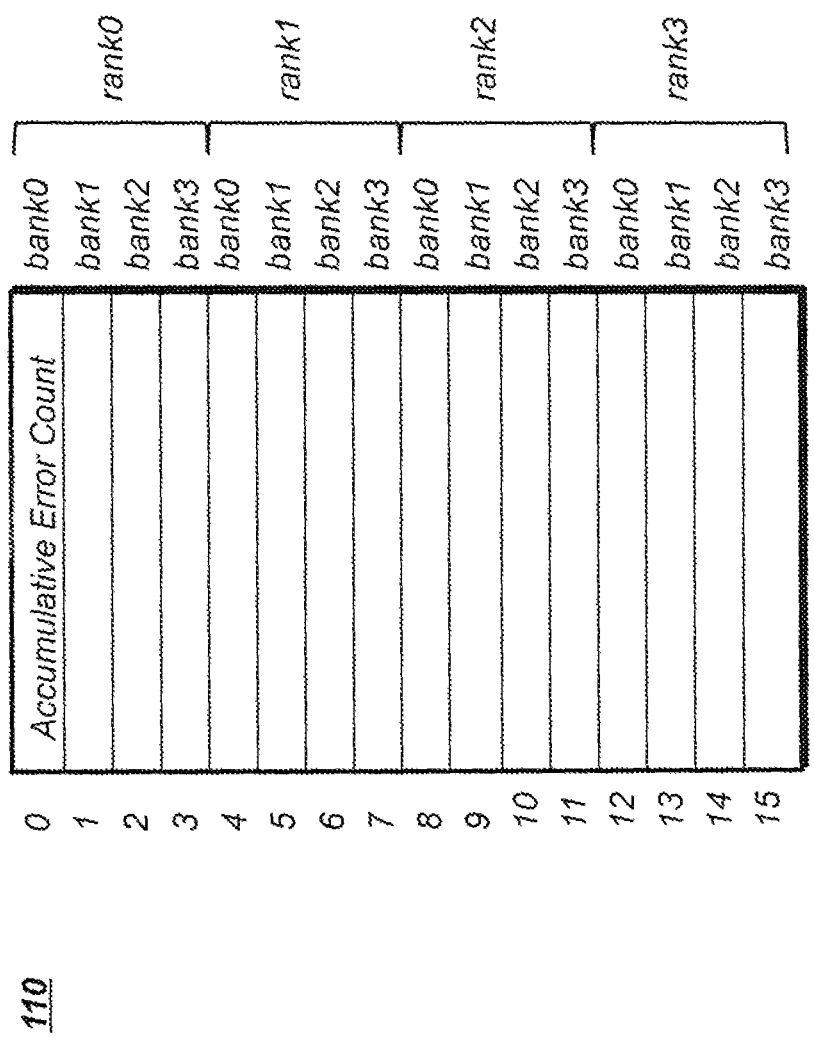
FIG. 3 is a data structure of an error register in FIG. 2.

FIG. 3 illustrates a data structure of the error register in FIG. 2.

In the disclosure it is assumed that the semiconductor memory device includes 4 ranks each including 4 banks. The error register may include 16 memory spaces each storing number of errors occurring at the corresponding bank.

The error register 110 may find out where the error occurred by analyzing error handling information from the ECC block 6. Then the error register 110 may update a count in the memory space corresponding to the bank where the error occurred.

The error register 110 may comprise volatile memory device, which may be initialized when a system restarts.

The mode selector 120 may check the error register 110 to compare number of errors at each memory space with a threshold value and may select a refresh mode for the corresponding bank.

Figure 4:
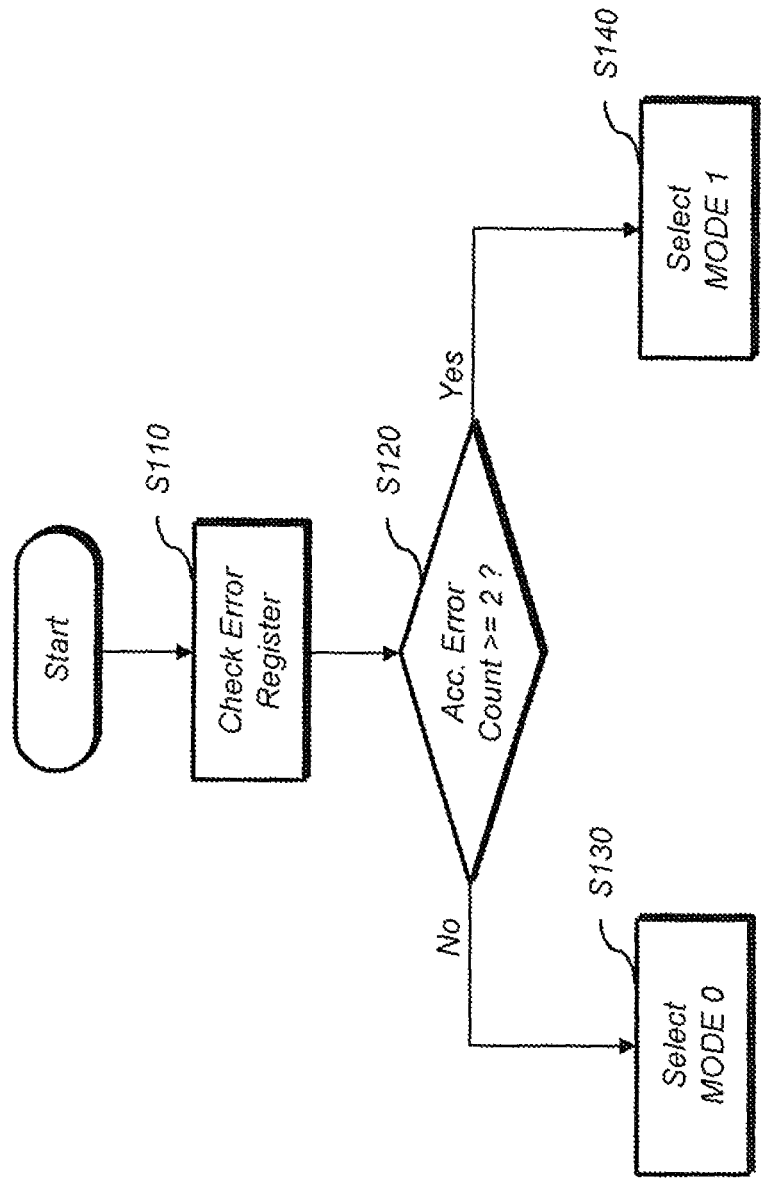
FIG. 4 is a flow chart illustrating an operation of the mode selector of FIG. 2.

FIG. 4 is a flow chart illustrating an operation of the mode selector 120 for a memory space of the error register 110 of FIG. 2.

The mode selector 120 may check error counts at the memory space 110 at step S110 and compare the error counts with a threshold value, which is 2 in an embodiment at step S120.

If the error count is smaller than the threshold value, the mode selector 120 may select MODE 0 for the bank corresponding to the memory space at step S130.

If the error count is as same as or larger than the threshold value, the mode selector 120 may select MODE 1 for the bank corresponding to the memory space at step S140.

The MODE 0 in an embodiment may represent a refresh mode with normal refresh period such as 64 ms and the MODE 1 may represent a refresh mode with shorter refresh period that the normal refresh period.

The number of threshold values, specific values of the threshold values, number of refresh modes and specific values of the refresh periods at the refresh modes may vary according to embodiments. The mode selector 120 may store a refresh mode in relation to each bank.

In other embodiments, the error register 110 may include further memory space to store refresh modes for each bank. In this case, the refresh request generator 130 may check the error register 110 to generate a refresh request for a rank/bank.

The timing when the mode selector 120 operates may also be variously embodied.

In an example, the mode selector 120 may compare the error count with a threshold value right after the error count is updated and may determine a refresh mode for the corresponding bank.

In another example, the mode selector 120 may periodically checks all memory spaces in the error register 110 and may determine refresh modes for all banks. In this case, the error register 110 may be reset after refresh modes are determined for all banks and the mode selector 120 may determine a refresh mode for a bank based on error counts accumulated during a period.

The refresh request generator 130 may generate refresh requests for a bank with a refresh period determined by a refresh mode set for the bank and provides the refresh requests to the arbiter 3.

The refresh request generator 130 may generate a clock signal and the refresh request generator 130 may generate a pulse signal from the clock signal illustrated in FIG. 2 where the pulse signal may have a period as same as a refresh period.

The refresh request generator 130 may provide bank address along with the refresh request to the arbiter 3. The bank address may be combined with the request and may be encoded as required by the arbiter 3.

Figure 5:
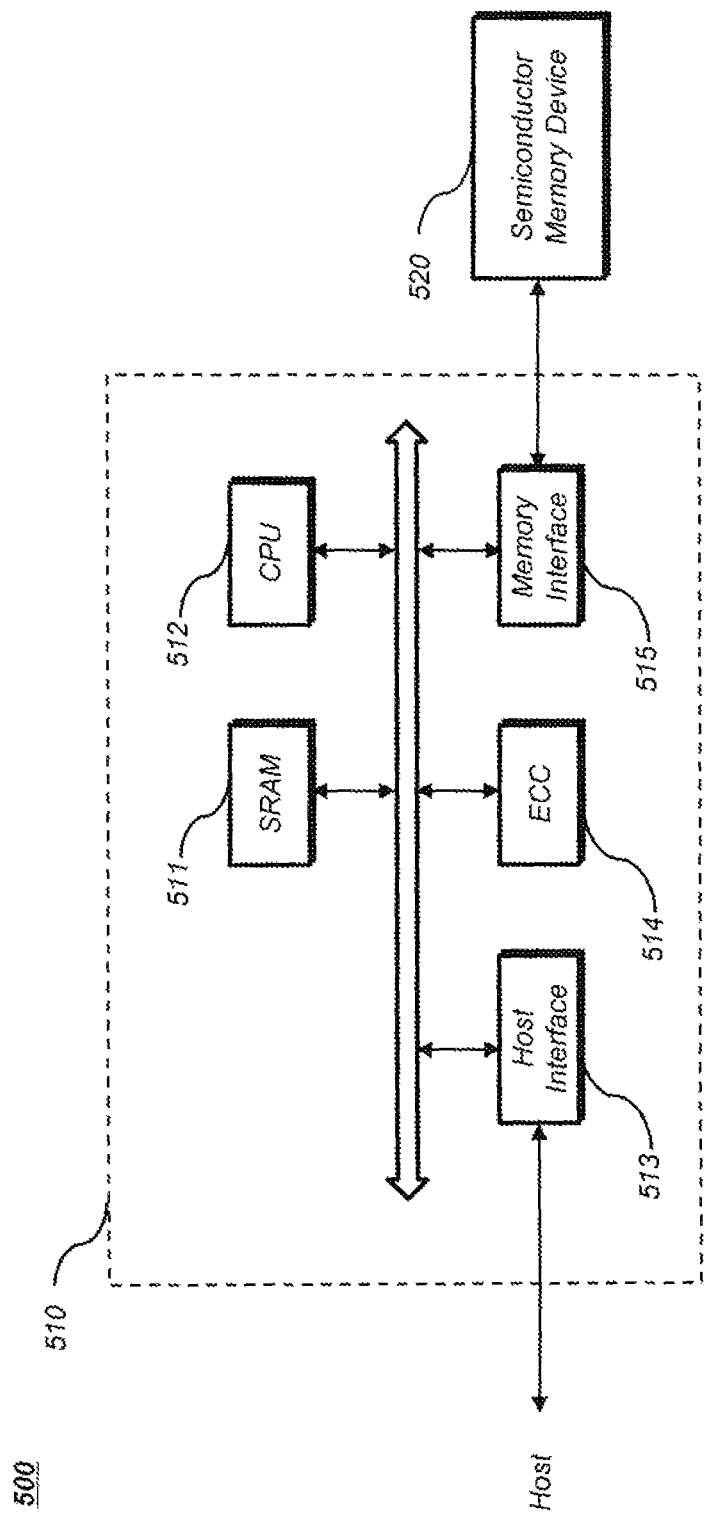
FIG. 5 is a block diagram illustrating a memory system in accordance with an embodiment of the present invention.

FIG. 5 is a block diagram illustrating a memory system according to an embodiment of the present invention.

In FIG. 5, the memory system 500 may include a semiconductor memory device 520 and a memory controller 510.

The memory controller 510 my control the semiconductor memory device 520, and may include a static random-access memory (SRAM) 511, a central processing unit (CPU) 512, a host interface 513, an ECC 514, and a memory interface 515. The SRAM 511 may be used as an operation memory of the CPU 512. The CPU 512 may perform control operation for data exchange of the memory controller 510, and the host interface 513 may have a data exchange protocol of a host accessed to the memory system 500. The ECC 514 may detect and correct error of a data read from the semiconductor memory device 520, and the memory interface 515 may interface with the semiconductor memory device 520. The memory controller 510 may include further read-only memory (ROM).

FIG. 6 is a view illustrating a computing system according to an embodiment of the present invention.

In FIG. 6, the computing system 600 may include a CPU 620 connected electrically to a system bus 660, a random-access memory (RAM) 630, a user interface or output device 640, an input device 650, and a memory system 610 including a memory controller 611 and a semiconductor memory device 612. In a case where the computing system 600 is a mobile device, a battery (not shown) for supplying an operation voltage to the computing system 600 may be further provided. The computing system 600 of the present invention may further include an application chipset, a complementary metal-oxide-semiconductor (CMOS) image processor CIS, a mobile DRAM, etc.

The output device or user interface 640 may be a self-contained display in the case of a portable electronic device. The input device or modem 650 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 610 may include a semiconductor memory device as described in FIG. 5.

Although various embodiments have been described for illustrative purposes, it will be apparent to those skilled in the art that various changes and modifications may be made without departing from the spirit and scope of the invention as defined in the following claims.

What is claimed is:

1. An operating method of a semiconductor device comprising:
    monitoring error handling information corresponding to an address of a semiconductor memory device;
    setting a refresh period for the address considering the error handling information corresponding to the address; and
    requesting a refresh request for the address.

2. The operating method of claim 1, wherein the monitoring error handling information comprises
    receiving error detection information and/or error correction information for a data read from the address of the semiconductor memory device; and
    updating number of errors occurred at the address.

3. The operating method of claim 2, wherein the updating comprises
    setting a first period as a refresh period for the address when the number of errors is smaller than a first threshold value; and
    setting a second period shorter than the first period as the refresh period for the address when the number of errors is larger than the first threshold value.

4. The operating method of claim 3, further comprising setting a third period shorter than the second period as the refresh period for the address when the number of errors is larger than a second threshold value larger than the first threshold value.

5. The operating method of claim 4, wherein the address is a bank address.

6. A semiconductor device comprising:
    an error handling block detecting and/or correcting an error in a data of an address of a semiconductor memory device and generating error handling information corresponding to the address; and
    a controller generating a refresh request for the address with a refresh period determined by the error handling information corresponding to the address.

7. The semiconductor device of claim 6, wherein the refresh controller comprises an error register storing number of errors occurring at the address,
    wherein the refresh controller determines the refresh period of the address according to the number of errors at the address.

8. The semiconductor device of claim 7, wherein the refresh controller further comprises:
    a mode selector for determining a refresh mode at the address by referring the error register; and
    a refresh request generator for generating the refresh request for the address with the refresh period determined for the refresh mode at the address.

9. The semiconductor device of claim 8, wherein the refresh request generator comprises:
    a clock signal generator for generating a first clock signal; and a pulse signal generator for generating a pulse signal from the first clock signal having a period as same as the refresh period at the address.

10. The semiconductor device of claim 6, further comprising:
   an arbiter for determining a processing order among requests from a host and a refresh request from the refresh controller; and
   a command generator for generating a command signal corresponding to a request selected at the arbiter to control the semiconductor memory device.

11. The semiconductor device of claim 6, wherein the address is a bank address.

12. A system comprising:
   a semiconductor memory device; and
   a memory controller for controlling the semiconductor memory device, wherein the memory controller comprises:
      an error handling block detecting and/or correcting an error in a data of an address of the semiconductor memory device and generating error handling information corresponding to the address; and
      a refresh controller generating a refresh request for the address with a refresh period determined by the error handling information corresponding to the address.

13. The system of claim 12, wherein the refresh controller comprises an error register storing number of errors occurring at the address and the refresh controller determines the refresh period of the address according to the number of errors at the address.

14. The system of claim 13, wherein the refresh controller further comprises
   a mode selector for determining a refresh mode at the address by checking the error register; and
   a refresh request generating block for generating the refresh request for the address with the refresh period determined by the refresh mode at the address.

15. The system of claim 14, wherein the refresh request generating block comprises
   a clock signal generator for generating a first clock; and
   a refresh pulse generator for generating a pulse signal from the first clock signal having a period same as the refresh period at the address.

16. The system of claim 12, wherein the memory controller further comprises
   an arbiter for determining a processing order among requests from a host and a refresh request from the refresh controller; and
   a command generator for generating a command corresponding to a request selected at the arbiter to control the semiconductor memory device.

17. The system of claim 12, wherein the address is a bank address.

* * * * *